(12) United States Patent
Daubenspeck et al.

(10) Patent No.: US 8,138,099 B1
(45) Date of Patent: Mar. 20, 2012

(54) CHIP PACKAGE SOLDER INTERCONNECT FORMED BY SURFACE TENSION

(75) Inventors: Timothy H. Daubenspeck, Colchester, VT (US); Jeffrey P. Gambino, Westford, VT (US); Christopher D. Muzzy, Burlington, VT (US); Wolfgang Sauter, Charlotte, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/948,079

(22) Filed: Nov. 17, 2010

(51) Int. Cl.
*H01L 21/302* (2006.01)
(52) U.S. Cl. ........................................................ 438/754
(58) Field of Classification Search .................. None
See application file for complete search history.

(56) References Cited

U.S. PATENT DOCUMENTS

2009/0221152 A1* 9/2009 Dietz et al. .................... 438/754
2010/0193945 A1* 8/2010 Hochstenbach et al. ...... 257/737

OTHER PUBLICATIONS

Harsh et al., "Solder Self-Assembly for MEMS," 1998, 7 pages, Proc. 1998 Int. Instrumentation Symposium.
Rao et al., "Self-Assembly Solder Process to Form Three-Dimensional Structures on Silicon," Jan./Feb. 2009, pp. 76-80, J. Vacuum Science Technology B27 (1), American Vacuum Society.

* cited by examiner

*Primary Examiner* — Charles Garber
*Assistant Examiner* — Andre' C Stevenson
(74) *Attorney, Agent, or Firm* — Richard M. Kotulak; Hoffman Warnick LLC (57) ABSTRACT

Disclosed herein is a solder self-assembly structure, an IC chip including a solder self-assembly structure, and a method of making the same. The structure includes a release layer disposed on a portion of an upper surface of the substrate, laterally spaced from a via in the substrate. A barrier layer metallization (BLM) is disposed in a first part over a portion of the substrate including a via, and in a second part over the release layer, leaving a surface of the substrate exposed between the first portion and the second portion of the BLM. A solder structure is disposed over the first and second portions of the BLM and the exposed surface of the substrate disposed there between. When the solder structure is reflowed and annealed, surface tension in the solder causes self-assembly of a three-dimensional, compliant solder structure.

20 Claims, 8 Drawing Sheets

CHIP PACKAGE SOLDER INTERCONNECT FORMED BY SURFACE TENSION

FIELD OF THE INVENTION

This disclosure relates generally to integrated circuit (IC) chip package processing, and more particularly to the production of IC chip packages using a self-assembly controlled collapse chip connection (C4) solder structure formed using surface tension to join an IC chip to a package.

BACKGROUND

Lead-free (Pb-free) solder bumping technology is replacing the use of high-Pb alloys for chip package interconnection in advanced integrated circuit (IC) technologies. The increasing demand for smaller solder bumps, higher current per bump, larger die sizes, and other features drive increasingly challenging requirements for bump electrical, thermal, and mechanical performance, particularly with flip chip plastic ball grid array organic laminate packages.

Standard processing methods may encounter challenges, however. Due to the coefficient of thermal expansion of the solder, following chip package join by reflowing and annealing the solder, the solder may undergo stress as it cools. This physical stress may cause breakage of either the IC chip, the solder, or the connection.

"Cladding" of Pb-free solder bumps by encasing the solder bumps with Ni, Cu, or similar alloys protects the solder bumps, and provides a redundant current connection in the event of electromigration degradation within the solder, in the form of excessive intermetallic compound formation, voiding, or even mechanical failure. Typical processing used to form a solder bump with cladding is complex, however, and can be difficult to integrate into manufacturing.

BRIEF SUMMARY

A first aspect of the disclosure provides a method for making integrated circuit (IC) chip packages. The method comprises providing a substrate; etching a via in the substrate; and forming a release layer on a portion of a surface of the substrate laterally distanced from the via. A barrier layer metallization (BLM) is deposited over a surface of the substrate and the release layer, wherein depositing the BLM includes depositing a first layer over the release layer and the substrate, and depositing a second layer over the first layer. The BLM is patterned such that the BLM is disposed in a first part above the release layer and in a second part on a portion of the substrate including the via, wherein a surface of the substrate is exposed between the first portion and the second portion of the BLM. A solder structure is deposited by electroplating the solder structure over the first portion of the BLM, the second portion of the BLM, and the exposed substrate surface between the first and second portions of the BLM. The method further includes etching the release layer; reflowing the solder structure; and annealing the solder structure, joining the substrate to a package.

A second aspect of the disclosure provides a solder self-assembly structure for an IC chip comprising: a release layer disposed on a portion of an upper surface of the substrate, laterally spaced from a via in the substrate; a barrier layer metallization (BLM) disposed in a first part over a portion of the substrate including a via, and in a second part over the release layer, wherein a surface of the substrate is exposed between the first portion and the second portion of the BLM; and a solder structure disposed over the first and second portions of the BLM and the exposed surface of the substrate disposed there between. The release layer may be the same size or smaller than the solder structure, facilitating chip joining.

A third aspect of the disclosure provides an integrated circuit (IC) chip package comprising: a plurality of solder self-assembly structures, each structure comprising: a release layer disposed on a portion of an upper surface of the substrate, laterally distanced from a via in the substrate; a barrier layer metallization (BLM) disposed in a first part over the substrate including a via, and in a second part over the release layer, wherein a surface of the substrate is exposed between the first portion and the second portion of the BLM; and a solder structure disposed over the first and second portions of the BLM and the exposed surface of the substrate disposed there between. The release layer is etched prior to reflowing and annealing of the solder self-assembly structure, and the plurality of solder self-assembly structures are arranged such that the release layer on each solder self-assembly structure is oriented radially outwardly relative to a center of the substrate.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Referring to the drawings, FIGS. 1-6 depict a solder structure for an integrated circuit (IC) chip package and method of making the same in accordance with embodiments of the invention.

Figure 1:
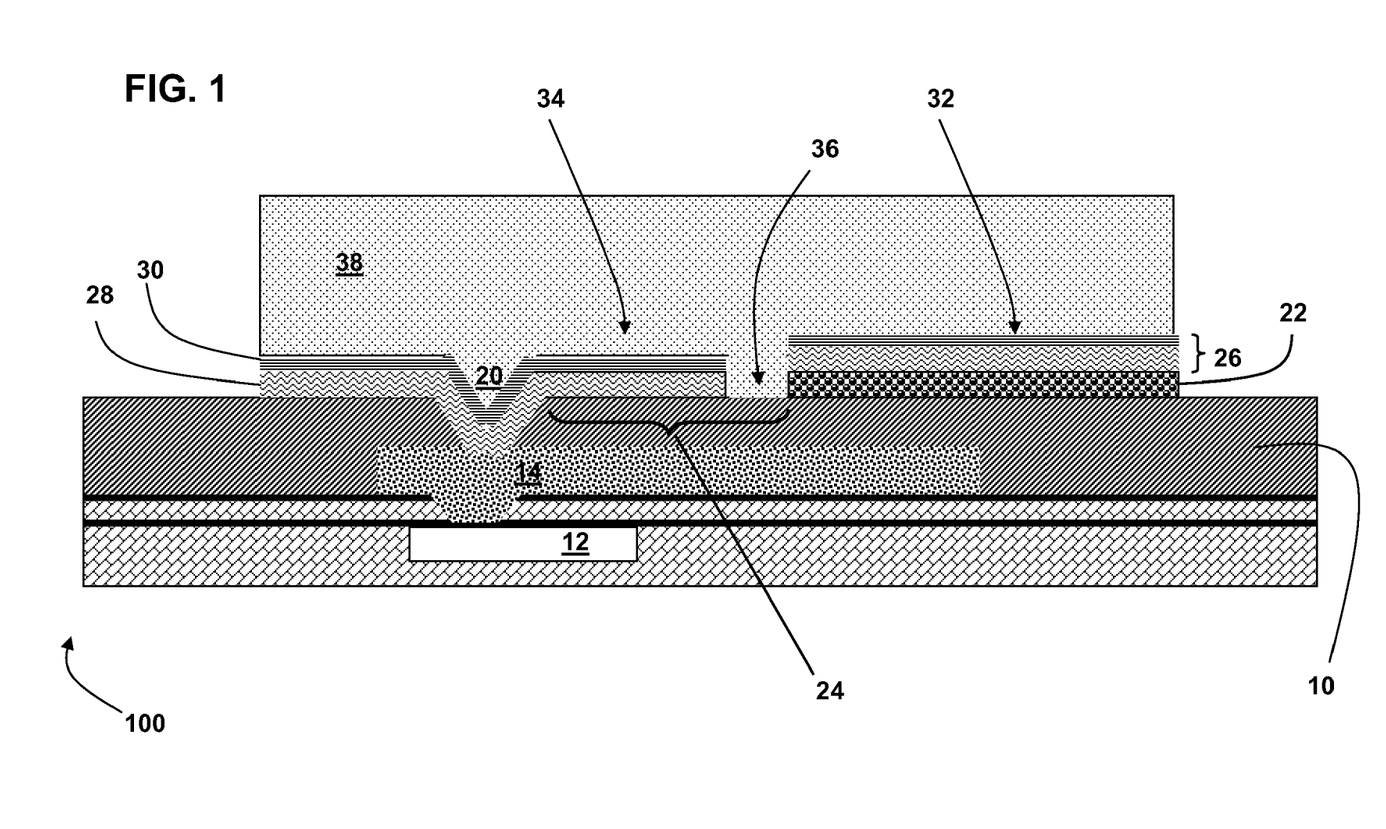
FIGS. 1-2 shows a cross section view of an IC chip according to an embodiment of the invention.
Figure 2:
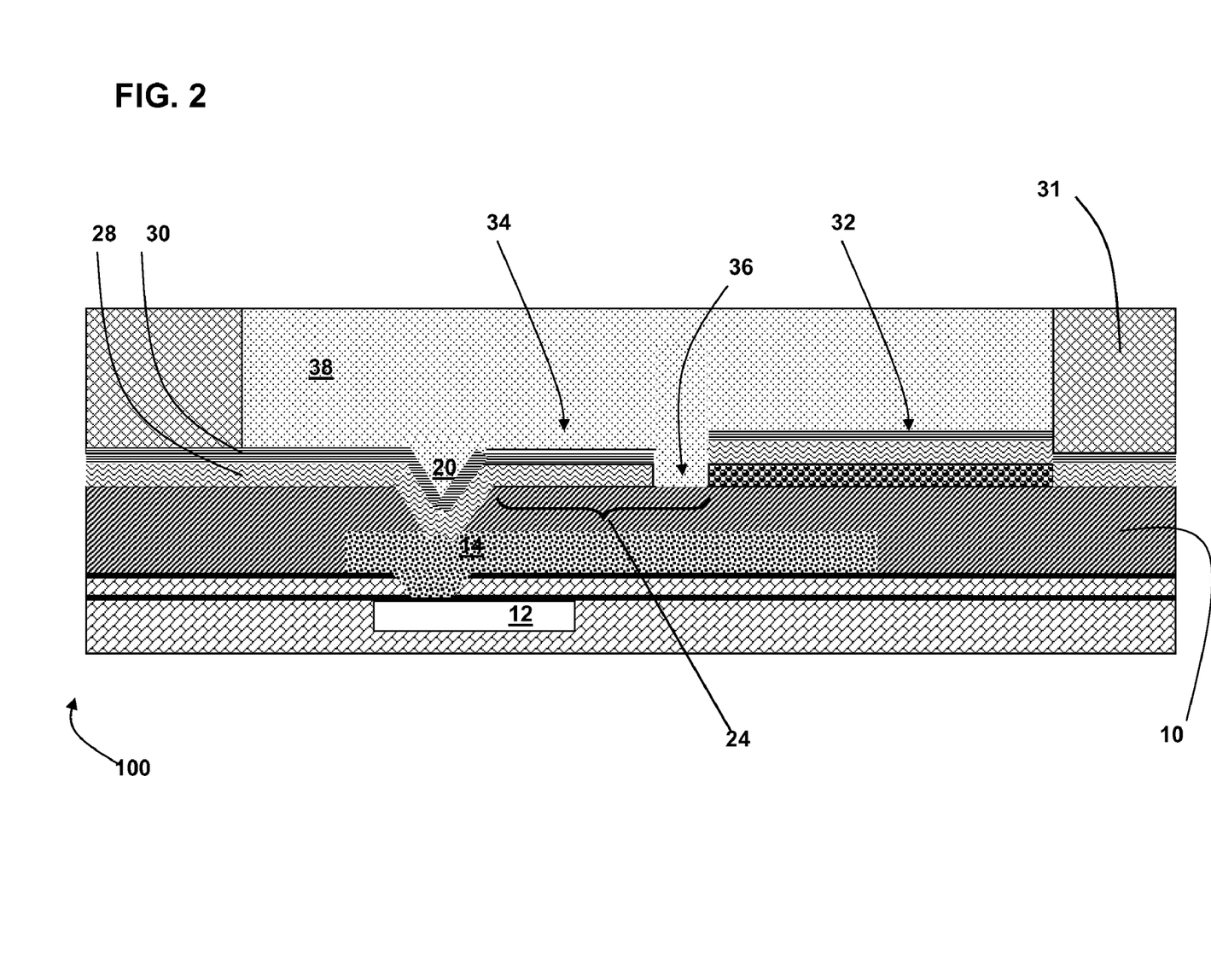

FIGS. 1-2 shows a substrate 10, which may be polyimide, and which may include copper wire 12, aluminum pad 14, and other features as known in the art. Via 20 may be etched in substrate 10. A release layer is deposited over a portion of a surface of substrate 10 and patterned, forming release layer 22 laterally distanced from via 20 by a first distance 24. In one embodiment, release layer 22 may comprise SiO$_2$. In other embodiments, release layer 22 may be Si, Ge, Al, Ti, W, a polymer, or SiN.

Figure 5:
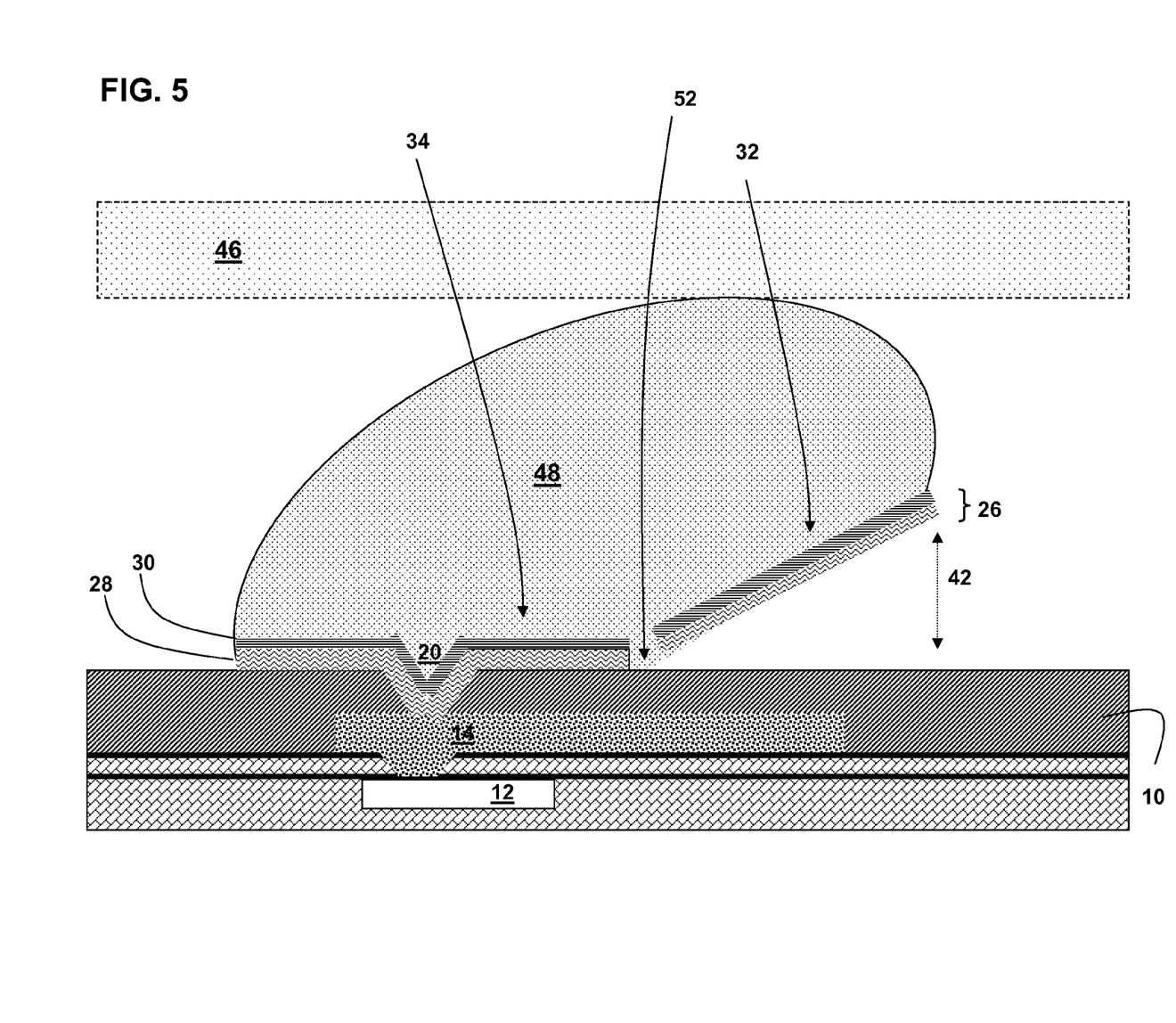
FIG. 5 shows a cross section view of an IC chip according to the embodiment of FIG. 3.

As shown in FIGS. 1-2, a barrier layer metallization (BLM) 26 is deposited over a surface of substrate 10 and release layer 22. BLM 26 includes a first layer 28 over release layer 22 and substrate 10, and a second layer 30 over first layer 28. In various embodiments, first layer 28 of BLM 26 may comprise TiW, and second layer 30 may comprise one of Cu, Ni, or an alloy. Various combinations of materials for first layer 28/second layer 30 exist. In one embodiment, first and second layers 28/30 may be TiW/Cu. In other embodiments, first and second layers 28/30 may be Ti/Ni, Cr/Cu/Au, or Al/NiV/Cu. Regardless of material, second layer 30 of BLM 26 provides a redundant conductor between substrate 10 and package 46 in future steps (FIG. 5). Release layer 22 is disposed vertically between BLM 26 and substrate 10.

As further shown in FIG. 1, BLM 26 is patterned, such that BLM 26 is disposed in a first part 32 above release layer 22, and in a second part 34 on a portion of the substrate 10 including the via 20. A surface 36 of the substrate, or slot, is exposed between first part 32 and second part 34 of BLM 26. A resist 31 (FIG. 2) is formed for depositing solder, and a solder structure 38 is deposited, e.g. by electroplating, ball drop, solder paste screening, or C4NP (control collapsed chip connection new process), over first part 32 of BLM 26, second part 34 of BLM 26, and the exposed substrate surface 36 between the first 32 and second portions 34 of BLM 26. Release layer 22 may be shaped and dimensioned such that release layer 22 is the same size or smaller than solder structure 38. Note that if solder is deposited by ball drop method, solder paste screening, or C4NP method, then BLM 26 is completely patterned prior to solder deposition. If solder structure 38 is deposited by electroplating, then the BLM 26 is partially patterned prior to solder deposition (forming surface or slot 36, as shown in FIG. 2), then additional patterning of BLM 26 is performed after deposition of solder 38 to electrically isolate the solder bumps. In an embodiment, a Pb-free solder may be used. Solder structure 38 may be a controlled collapse chip connection (C4).

Figure 3:
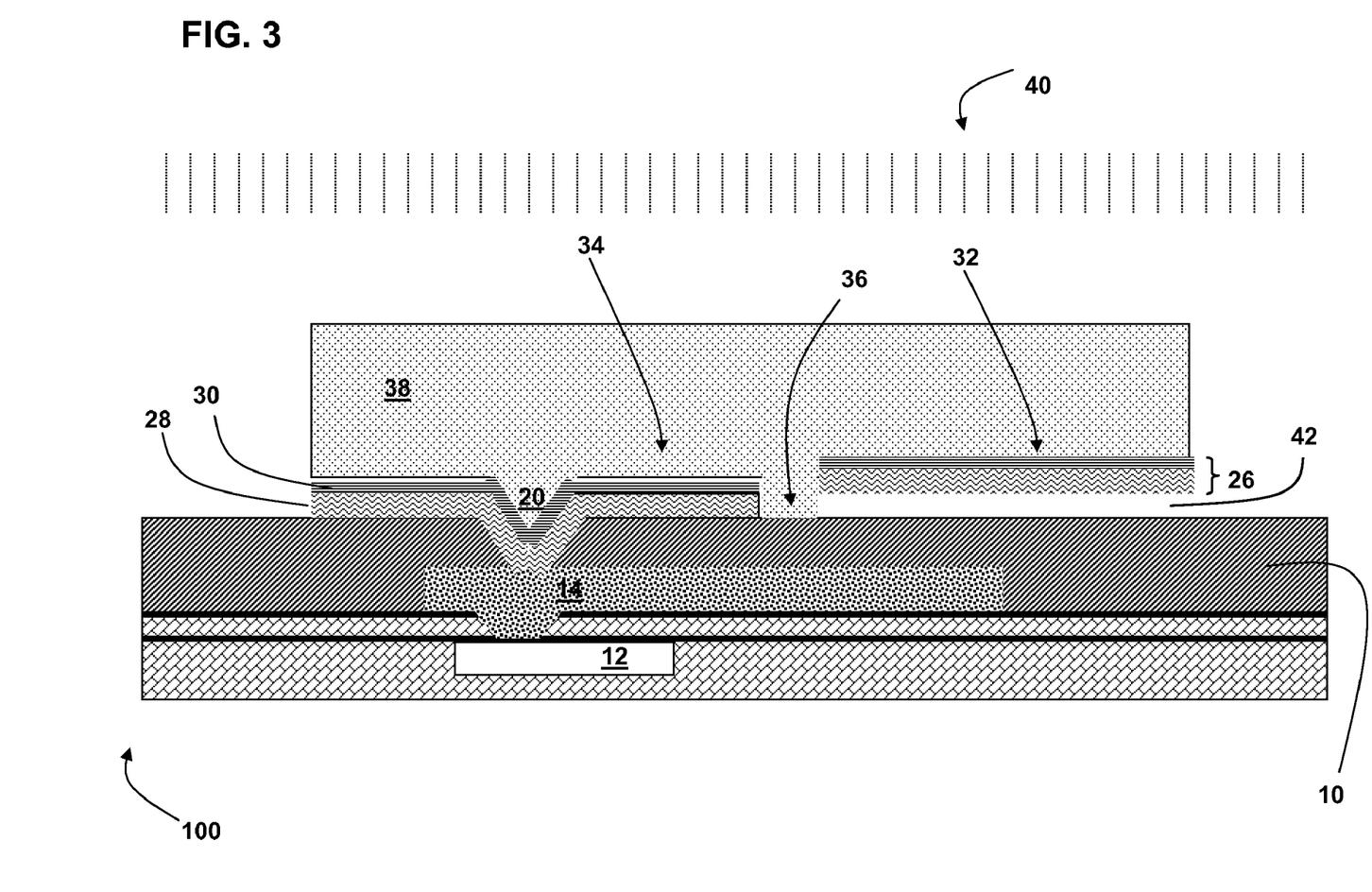
FIG. 3 shows a cross section view of an IC chip according to an embodiment of the invention.

Resist layer 31 is then stripped. As shown in FIG. 3, release layer 22 is etched 40, undercutting BLM 26 and solder structure 38. By way of non-limiting example, an HF-based etch may be used for SiO$_2$ or Ti, a KOH-based etch may be used for Si, H$_2$O$_2$-based etch may be used for Ge or W, and an H$_3$PO$_4$-based etch may be used for Al. In one embodiment, depicted in FIG. 3, a gap 42 is left vertically disposed between substrate 10 and BLM 26. Alternatively, in the embodiment depicted in FIG. 4, release layer 22 may be etched 40, resulting in a patterned release layer 44 fabricated with the layout of the release layer 22, resulting in a release layer 44 patterned into fingers.

As shown in FIG. 5, solder structure 38 (FIGS. 3-4) is reflowed and annealed, at which point the reflowed solder self-assembly structure 48 joins substrate 10 to a chip package 46 (shown in phantom). Reflowing deposited solder structure 38 at a high heat utilizes surface tension of the solder to initiate self-assembly of a three-dimensional solder structure 48. Surface tension is determined by torque due to surface energy and Laplace pressure of molten solder. Upon reflowing, surface tension forces cause the solder to minimize its surface area. If the solder joins two surfaces in which one of the surfaces is relatively unconstrained, the free surface will rotate to a point at which the solder reaches its lowest surface energy. As shown in the embodiment in FIG. 5, this may result in the solder bump folding upward; the force of the surface tension may vertically lift first part 32 of BLM 26 away from the surface of substrate 10, creating a three-dimensional solder self-assembly structure 48 interconnecting substrate 10 and package 46. Exposed substrate surface 36 (FIGS. 1-4), which contacts deposited solder structure 38, acts as a hinge joint 52. The flexibility imparted to solder self-assembly structure 48 by this arrangement of features produces a more compliant solder structure 48, and decreases the incidence of breakage of either substrate 10 or solder self-assembly structure 48 during a cooling period following reflowing and annealing of the solder.

The three-dimensional solder connection depicted in FIG. 5 depicts a later processing step in the embodiment of FIG. 3, however, this is only one possible embodiment. Where, as in FIG. 4, etch 40 results in a patterned release layer 44 (FIG. 4), patterned release layer 44 may also provide flexibility and compliance to solder self-assembly structure 48.

Figure 6:
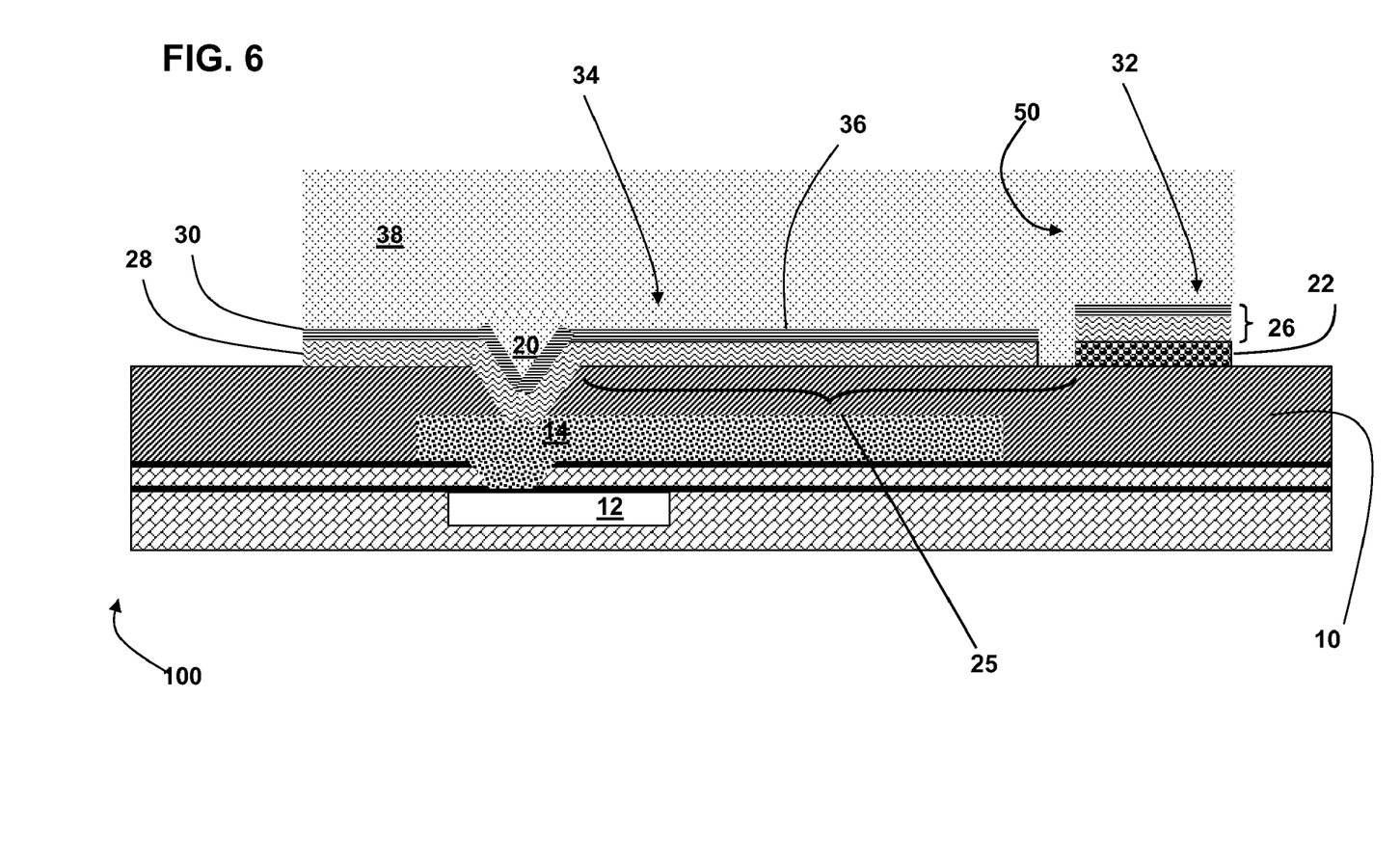
FIG. 6 shows a cross section view of an IC chip according to an embodiment of the invention.
Figure 8:
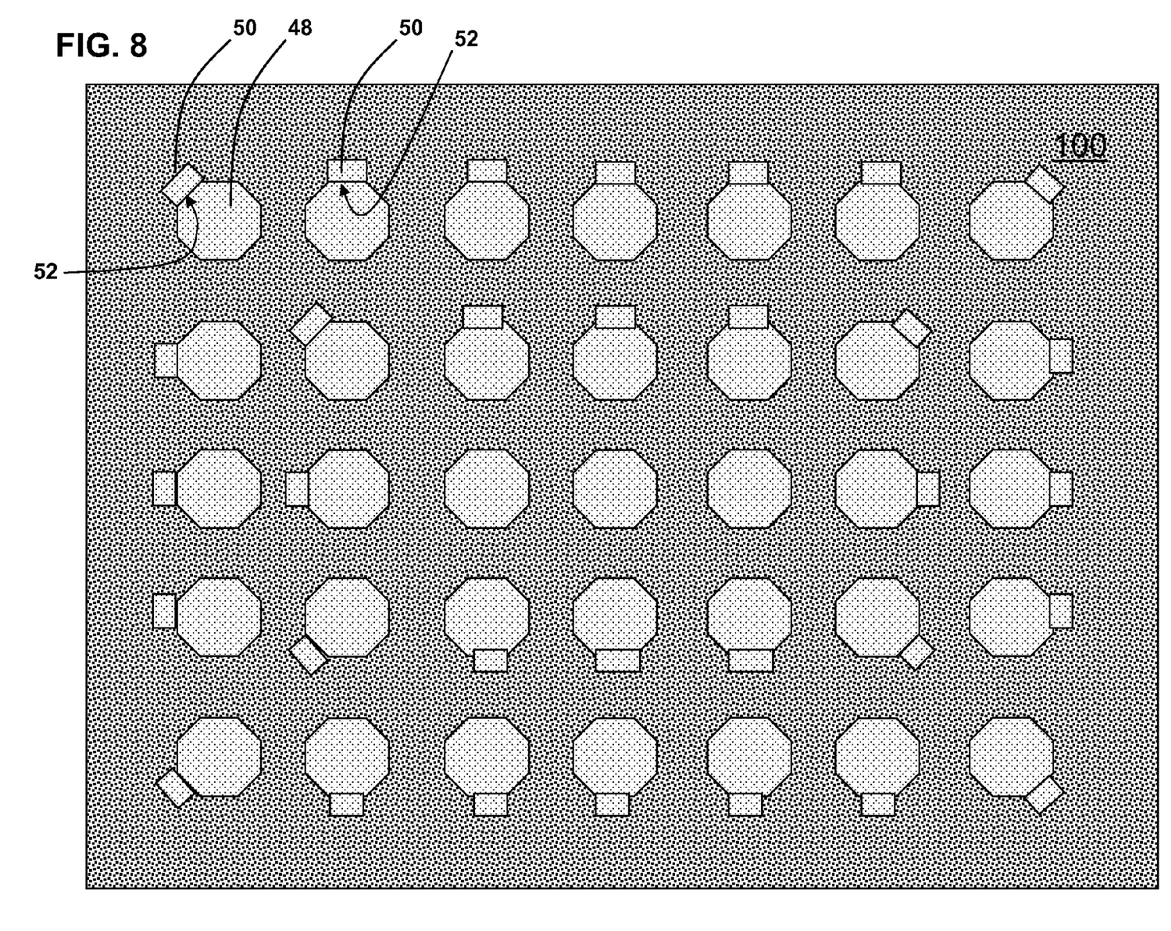

As shown in FIGS. 6 and 8, in still another embodiment, a solder tab 50 and release layer 22 are added to the standard solder ball layout, in which release layer 22 is deposited over a portion of a surface of substrate 10 and patterned, forming release layer 22 laterally distanced from via 20 by a second distance 25. When the embodiment of FIG. 6 is etched 40 as described relative to FIG. 3 and reflowed and annealed as described relative to FIG. 5, release layer 22 is etched from beneath BLM 26, leaving a tab 50 made of the remaining BLM 26 with solder 38 layered above it, laterally extending from solder structure 38 (see FIG. 8). Upon reflowing of solder structure 38, tab 50 imparts compliance to the final three-dimensional solder self-assembly structure 48. Relative to previously described embodiments, tab 50 results in a larger area for current conduction through solder structure 48, and lower resistance. It may, however, increase the minimum size of the solder structure 48 footprint.

Figure 4:
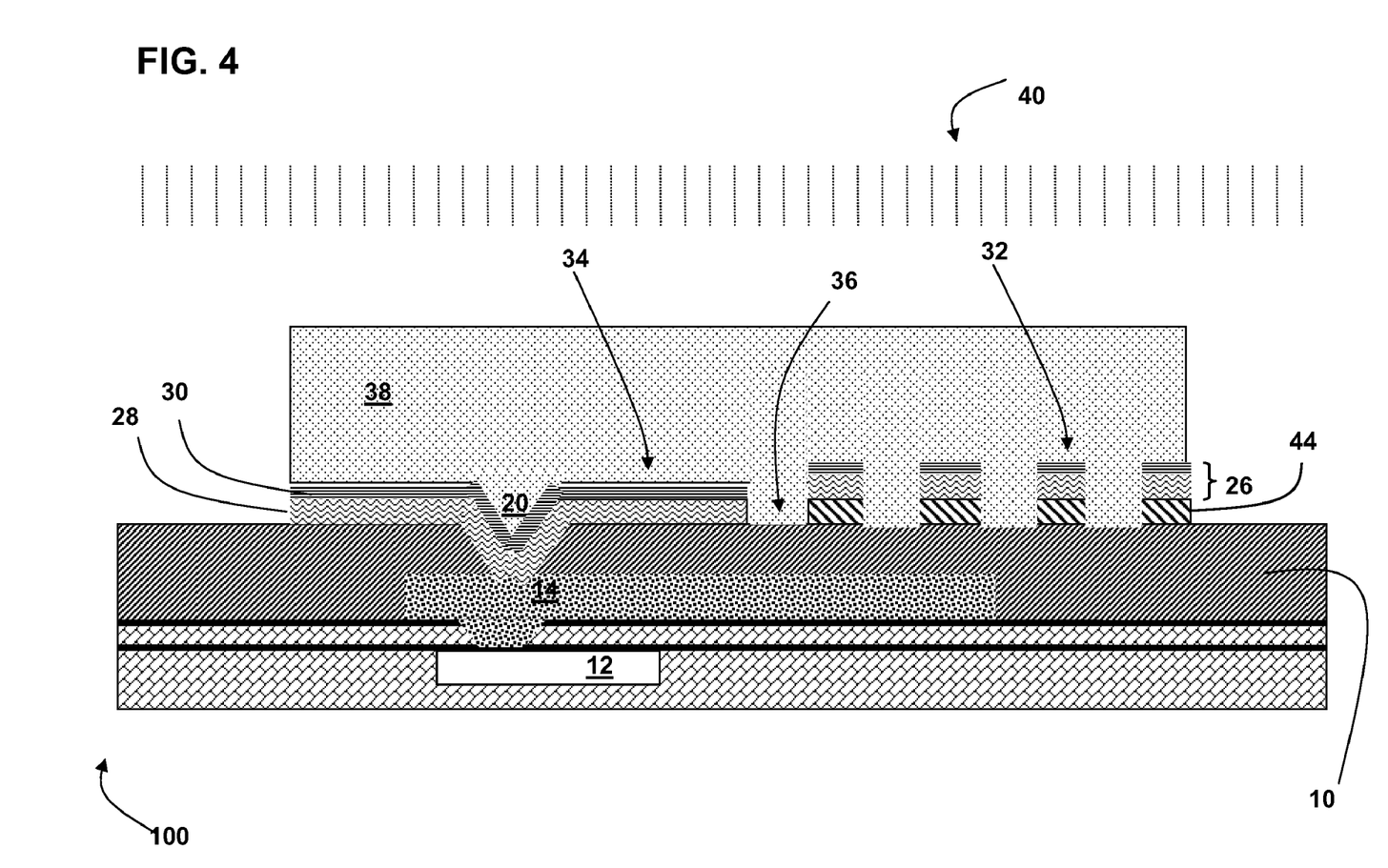
FIG. 4 shows a cross section view of an IC chip according to an embodiment of the invention.
Figure 7:
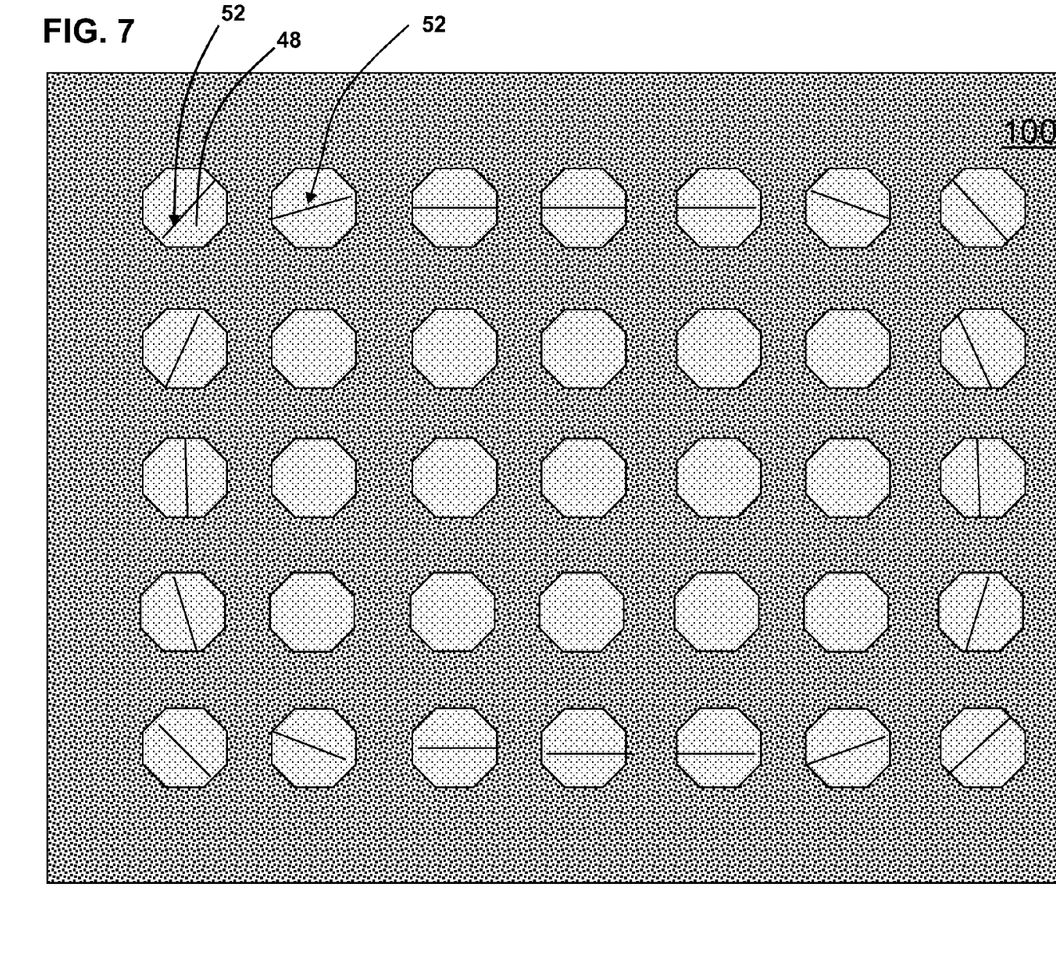
FIGS. 7-8 show top views of an IC chip according to two embodiments of the invention.

As shown in FIGS. 7-8, a further embodiment provides an integrated circuit (IC) chip package including a plurality of solder self-assembly structures 48 as described above. In the embodiment shown in FIG. 7, solder self-assembly structures 48 may have been formed by either removing or patterning release layer 22, as depicted in FIGS. 3 and 4 and described above. In the embodiment shown in FIG. 8, solder self-assembly structures 48 may have been formed as depicted in FIG. 6.

Regardless of how formed, each of the plurality of solder self-assembly structures 48 is arranged such that release layer 22 on each solder self-assembly structure 48, which results in gap 42, patterned release layer 44, or tab 50 depending on the embodiment, is oriented radially outwardly relative to a center of the chip 100. In various embodiments, the plurality of solder self-assembly structures 48 may comprise only an outermost row of solder structure connections on each of a plurality of edges of the IC chip 100 (FIG. 7), or they may include multiple rows around the periphery of chip 100 (FIG. 8).

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for making integrated circuit (IC) chip packages, the method comprising:
   providing a substrate;
   etching a via in the substrate;
   forming a release layer on a portion of a surface of the substrate laterally distanced from the via;
   depositing a barrier layer metallization (BLM) over a surface of the substrate and the release layer, wherein depositing the BLM includes depositing a first layer over the release layer and the substrate, and depositing a second layer over the first layer;
   patterning the BLM, such that the BLM is disposed in a first part above the release layer and in a second part on a portion of the substrate including the via, wherein a surface of the substrate is exposed between the first portion and the second portion of the BLM;
   depositing a solder structure over the first portion of the BLM, the second portion of the BLM, and the exposed substrate surface between the first and second portions of the BLM;
   etching the release layer;
   reflowing the solder structure; and
   annealing the solder structure, joining the substrate to a package.

2. The method of claim 1, wherein the reflowing the solder structure further includes a surface tension of the solder structure vertically lifting a segment of the BLM away from the surface of the substrate, creating a three-dimensional connection between the substrate and the package.

3. The method of claim 1, wherein the release layer comprises SiO2.

4. The method of claim 1, wherein the release layer is laterally disposed beneath a portion of the solder structure, and vertically disposed between the BLM and the substrate.

5. The method of claim 4, wherein the etching of the release layer further comprises removing the release layer.

6. The method of claim 4, wherein the etching of the release layer further comprises patterning the release layer.

7. The method of claim 1, wherein the release layer is disposed laterally adjacent to the solder structure, and the BLM and the solder structure form a tab laterally extending from the solder structure.

8. The method of claim 1, wherein the first layer of the BLM includes TiW.

9. The method of claim 1, wherein the second layer of the BLM includes one of Cu and Ni, and wherein the second layer of the BLM provides a redundant conductor between the substrate and the package.

10. The method of claim 1, wherein the solder structure comprises Pb-free solder.

11. A solder self-assembly structure for an IC chip comprising:
    a release layer disposed on a portion of an upper surface of the substrate, laterally spaced from a via in the substrate;
    a barrier layer metallization (BLM) disposed in a first part over a portion of the substrate including a via, and in a second part over the release layer, wherein a surface of the substrate is exposed between the first portion and the second portion of the BLM; and
    a solder structure disposed over the first and second portions of the BLM and the exposed surface of the substrate disposed there between;
    wherein the release layer is the same size or smaller than the solder structure.

12. The solder self-assembly structure of claim 11, wherein the release layer is substantially laterally disposed beneath the solder structure, and vertically disposed between the BLM and the substrate.

13. The solder self-assembly structure of claim 12, wherein the release layer further comprises one of a patterned release layer and a gap.

14. The solder self-assembly structure of claim 11, wherein the release layer is disposed laterally adjacent to the solder structure, and the BLM and the solder structure form a tab laterally extending from the solder structure.

15. The solder self-assembly structure of claim 11, wherein the BLM includes a first layer over the release layer and the substrate, and a second layer over the first layer,
    wherein the first layer includes TiW, and
    wherein the second layer includes one of Ni and Cu.

16. The solder self-assembly structure of claim 11, wherein the solder structure further comprises a three-dimensional connection between the substrate and the IC chip package, including a hinged portion and a vertically lifted portion.

17. An integrated circuit (IC) chip package comprising:
    a plurality of solder self-assembly structures, each structure comprising:
    a release layer disposed on a portion of an upper surface of a substrate, laterally distanced from a via in the substrate;
    a barrier layer metallization (BLM) disposed in a first part over the substrate including a via, and in a second part over the release layer, wherein a surface of the substrate is exposed between the first portion and the second portion of the BLM; and
    a solder structure disposed over the first and second portions of the BLM and the exposed surface of the substrate disposed there between,
    wherein the release layer further comprises one of a patterned release layer and a gap, and
    wherein the plurality of solder self-assembly structures are arranged such that the release layer on each solder self-assembly structure is oriented radially outwardly relative to a center of the IC chip.

18. The IC chip package of claim 17, wherein the plurality of solder self-assembly structures comprise an outermost row of solder structure connections on each of a plurality of edges of the IC chip.

19. The IC chip package of claim 17, wherein the solder structure further comprises a three-dimensional connection between the substrate and the IC chip package,
    wherein during reflowing, the solder structure further includes a surface tension which vertically lifts a segment of the BLM away from the surface of the substrate.

20. The IC chip package of claim 17, wherein the release layer comprises $SiO_2$.

* * * * *